United States Patent [19]

Menet et al.

[11] Patent Number: 4,965,491
[45] Date of Patent: Oct. 23, 1990

[54] PLASMA GENERATOR

[75] Inventors: Jacques Menet, Saint Egreve; Vincent Comparat, Grenoble, both of France

[73] Assignee: Centre National de la Recherche Scientifique, Paris, France

[21] Appl. No.: 30,026

[22] Filed: Mar. 25, 1987

[30] Foreign Application Priority Data

Mar. 26, 1986 [FR] France ............................ 86 04725

[51] Int. Cl.$^5$ .................................... H01J 1/00
[52] U.S. Cl. ......................... 315/111.21; 315/111.81; 315/5.19; 313/359.1; 313/230; 313/231.31; 250/423 R
[58] Field of Search ............... 250/423 R, 427; 313/230, 231.31, 359, 360, 293, 581; 315/4, 5.18, 5.19, 39, 111.01, 111.21, 111.31, 111.81

[56] References Cited

U.S. PATENT DOCUMENTS

| | | | |
|---|---|---|---|
| 3,149,262 | 9/1964 | Skellet | 315/168 |
| 3,156,842 | 11/1964 | McClues | 313/359 |
| 3,258,402 | 6/1966 | Farnsworth | 315/39 |
| 3,394,286 | 6/1968 | Brock | 315/111.91 |
| 3,495,769 | 2/1970 | Hirsch | 315/111.91 |
| 3,566,185 | 2/1971 | Gavin | 315/111.01 |
| 4,080,549 | 3/1978 | Creedon et al. | 313/231.3 X |
| 4,126,806 | 11/1978 | Kapetankos et al. | 313/359.1 X |
| 4,453,108 | 6/1984 | Freeman, Jr. | 315/5.18 |
| 4,620,102 | 10/1986 | Watanabe et al. | 250/427 |
| 4,639,642 | 1/1987 | Roberts et al. | 315/39 |
| 4,668,924 | 5/1987 | van de Sande | 315/39 |

FOREIGN PATENT DOCUMENTS

| | | | |
|---|---|---|---|
| 0111129 | 10/1983 | European Pat. Off. | 315/111.81 |
| 0106497 | 4/1984 | European Pat. Off. | 315/111.81 |
| 956970 | of 0000 | United Kingdom . | |
| 2097181 | of 0000 | United Kingdom . | |

OTHER PUBLICATIONS

Review of Scientific Instruments, vol. 35, No. 5, May 1964, pp. 573–577, New York, R. G. Herb et al., "Sublimation & Ion Pumping in Getter-Ion Pumps".

Rev. of Scient. Insts., vol. 35, No. 5, May 1964, pp. 569–572, N.Y., R. G. Herb et al., "Electrostatic Plasma Containment System & Electron Motion Through Grids".

Orbitron—R. G. Herb et al., Bull. Am. Phys. Soc. 8, 336, 1963.

French Search Report Annexe au Rappaport de Recherche Relatif a la Demande de Brevet Francais No. Fr. 8604725 (FA 379257).

Primary Examiner—James J. Groody
Assistant Examiner—Mark R. Powell
Attorney, Agent, or Firm—Lowe, Price, LeBlanc, Becker & Shur

[57] ABSTRACT

A plasma generator according to the invention comprises a chamber (2) at a first potential (V1) filled with a gas at a low pressure and a transparent electrode surface comprised of wires, grid or perforated plate (3) at a second potential (V2) higher than (V1). Thus, an electron (4) present in the chamber will be oscillating on both sides of the transparent electrode surface (3) for providing secondary electrons (11 and 12) which create in turn other secondary electrons (13–14, 15–16). At each occurence of an electron pair, one ion (i1, i2, i3, . . . ) is created.

10 Claims, 2 Drawing Sheets

PLASMA GENERATOR

This invention relates to a plasma generator. This invention has been made in the Nuclear Science Institute, Grenoble University 1, laboratory of the National Institute of Nuclear Physics and Particles Physics n°24021, National Institute of the Centre National de la Recherche Scientifique.

Such a plasma generator can have various applications. It can be used simply as a plasma source for scientifically analysing the operation of a plasma or for characterizing gases contained in the plasma. This plasma generator can also be used as a light source, an ion source, an ionic pump, a vacuum gauge, those applications not being limiting. The application of the invention as an ion source shall be more particularly explained but other applications of the invention shall be disclosed hereinafter.

In various industries, ionic implantations or ionic bombardments are used for modifying the features of materials. The conventional example consists in ionic implantation in semiconductor materials; and it is mainly in view of those applications that ionic implanters have been developed. Other applications of ionic implantations are appearing for improving features of materials. For example, nitrogen implantation in steel permits the provision of tools having increased hardening and non-corrosive properties. Also, plastics can be processed, for example for obtaining conductive plastics, which would allow obtaining conductors with a lower weight than the metallic conductors.

In these types of applications, it would be desirable to have large size ionic sources available for reducing the implantation time duration, the implantation being presently carried out by scanning from a source providing a low section ion beam.

French patent No. 79/08537 (publication No. 2,422,253) discloses an ion source with one or two parallel wires. In such devices, ions are provided only according to one dimension and are subject to instabilities when one wishes to increase the ion density by increasing the anode voltage for obtaining high intensity beams.

Also, in the field of pumping low pressure chambers, it is known to use ion generators, the ions being further collected. Some ionic pumps use a confining magnetic field which increases their weight and their cost. The electrostatic ionic pumps (Orbitron—R. G. Herb et al, Bull. Am. Phys. Soc. 8, 336, 1963) use a wire around which turn electrons which ionize the residual gas. The shape of the chamber is necessarily a cylinder.

French patent No. 1,534,721 (Sarrau) discloses an ionization chamber comprising a central plate or grid 3, having a mesh such as it reaches a high temperature. Therefore, such a grid or plate is not what is called hereinafter a transparent electrode. Moreover, in Sarrau, the plate or grid 3 is made of titanium and it is not possible to obtain in the chamber a pure ionized gas.

An object of the instant invention is to provide for a plasma generator having a large dimension and/or various patterns. By the term "large dimension", it is meant that the size of the device is limited only by practical problems and not by theoretical considerations. One could for example provide for an apparatus having a size larger than one square meter.

Another object of the invention is to provide for a particularly simple plasma generator.

Another object of the invention is to provide for a plasma generator usable as a light source, an ion source, an ionic pump, or a vacuum gauge.

For attaining those objects and others, the invention provides for a large size plasma generator comprising a chamber, at a first electrical potential (V1), filled with a low pressure gas to be ionized, such chamber containing a first transparent electrode surface at a second electrical potential (V2) higher than the first one with a quantity larger than the ionization threshold of the gas to be ionized. This apparatus does not use a magnetic field.

In an embodiment, a wall of the chamber is, at least partly, made of a second transparent electrode surface and the chamber is fully surrounded by a second chamber, the second chamber being at a potential (V3) lower or equal to the first potential.

In one embodiment, the third potential is the ground.

The gas pressure in the ionization chamber can be in the range of $10^{-1}$ to $10^{-4}$ torr.

Those objects, features and advantages of the invention together with the principle on which it is based will be explained in greater detail in the following description of a preferred embodiment made in connection with the attached drawings wherein.

Figure 4:
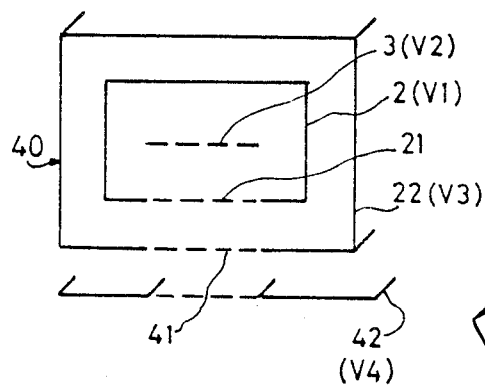
Figure 5:
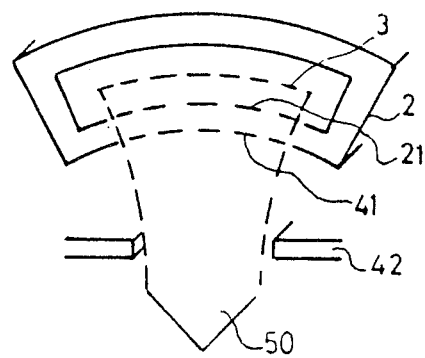
Figure 6:
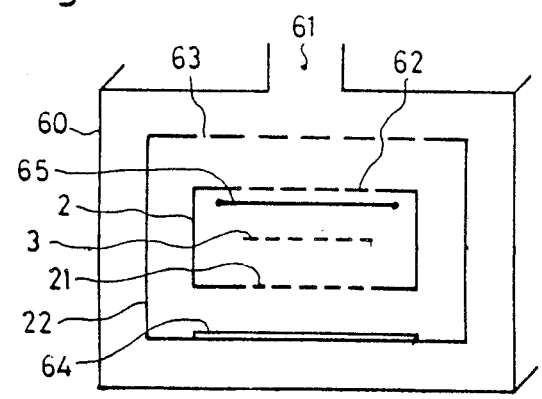

FIGS. 4 and 5 very schematically show two implementations of a plasma generator for use as an ion source; and FIG. 6 very schematically shows another implementation of the plasma generator according to the invention for use as an ionic pump.

The various drawings are not shown at any specific scale, the relative size of some elements having arbitrarily been made larger or smaller for facilitating understanding.

Also, elements for fixing or mechanically supporting the various electrodes and chambers have not been shown for simplifying the drawings as the implementation of such mechanical systems shall be straightforward for those skilled of the art.

Figure 1:
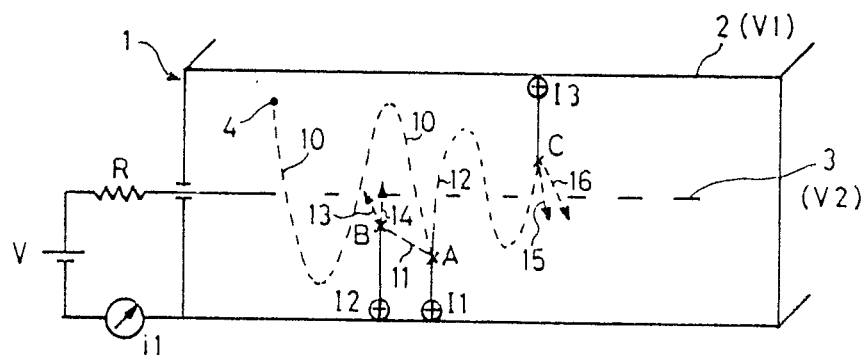
FIG. 1 is a cross-sectional and schematic view of a plasma generator according to the invention for explaining the operation thereof.

As shown in FIG. 1, in a system wherein is arranged a low pressure gas, the plasma generator 1 according to the invention comprises a first chamber 2 made of an electrically conductive material at a potential V1. In the drawing, this chamber is a cylinder having a rectangular cross-section. The low pressure gas corresponds to the ions to be formed, for example $O_2$, $N_2$, $H_2$, $K_r$, A, etc. The pressure regulation can be conventionally carried out by bringing in gas and pumping.

In chamber 2, is arranged a transparent electrode 3 at an electrical potential V2 higher than the potential V1.

In the present application, the term "transparent electrode" designates an electrode provided with apertures made for example of wires, a grid, or a perforated plate, permitting to establish an equipotential surface while leaving a free passage to particles such as ions or electrons, which can generally cross this transparent electrode without impinging on same; said equipotential surface can have any desired form, curvature and size in view of a specific result. However, it will be noted that the equipotential surface is an open surface (opposite to a closed surface such as a cylinder, a sphere, etc.).

The transparent electrode is mechanically held by supports crossing the chamber 2. Those supports are electrically insulated from chamber 2 to permit the voltage V2 of an external voltage source be applied to the electrode 3.

FIG. 1 shows an external circuit for operating such a generator comprising a voltage source V, a resistor R and a current measuring means (i1). The electric voltage V is chosen as follows:

$$V = Ri1 + (V2 - V1)$$

The operation of the device of FIG. 1 can be schematically explained as follows. If one considers an electron 4 generated inside the chamber 2—for example, from a cosmic ray or by a ionization resulting from collision—moving according to the dashed line 10, this electron is first attracted by the transparent electrode 3 at a potential V2 higher than the potential V1 of the chamber and then oscillates from one side to the other of the transparent electrode through which it is regularly attracted again. It is noted that the electrons produced in the chamber 2 shall be repelled by the walls thereof. If, at the position A, the electron collides with an atom or a molecule of the low pressure gas contained in the chamber, a positive ion $I_1$ and a second electron are produced. The ion $I_1$ is attracted by the chamber 2 where it is neutralized. Further to the collision, the two electrons (the initial electron and the newly created one) follow respective paths 11 and 12. The electron following the path 11 is submitted at the point B to a new collision with an atom of the gas contained in the chamber for providing a new ion $I_2$ and two new electrons according to paths 13 and 14. Similarly, the second electron following the path 12 is shown to collide with a new atom at the point C for providing an ion $I_3$ and two electrons which follow paths 15 and 16. Like ion $I_1$, the ions $I_2$ and $I_3$ are attracted by the walls of chamber 2 and the electrons following the paths 13, 14, 15 and 16 are in turn submitted to collisions for producing each time a new ion and two electrons. Therefore, if no damping phenomenon was present, the electrons would indefinitely multiply by successive powers of 2.

In fact, the phenomenon will be damped due to the necessarily non zero transparency of the transparent electrode 3, to possible collisions between the electrons and ions not yet extracted from the chamber and to other parasitic phenomena.

The features of the electronic and ionic multiplication are dependent upon the geometry of the generator, the nature of the materials constituting the chamber, the transparency of the electrode 3, and the difference V2−V1.

The above structure makes it possible to confine electrons without using a magnetic field and to multiply the same very efficiently by creating a variable electrical potential in a low pressure gas, and this result is obtained for a large diversity of chamber sizes and shapes. Therefore, if the difference V2−V1 is sufficiently large, a self-sustained and very stable gas discharge is obtained.

It will be understood that the invention is also distinct from the prior art systems as disclosed in The Review of Scientific Instruments, Vol. 35, N. 5, May 1964, page 569, which use the ionizing power of electrons oscillating in a gaseous volume but where, contrarily to the invention, the ionization volume is at a constant electrical potential and where therefore there is no possibility for amplifying through secondary electrons. Such devices operate only with the help of auxiliary electron sources (such as thermoelectronic emitters).

Figure 2:
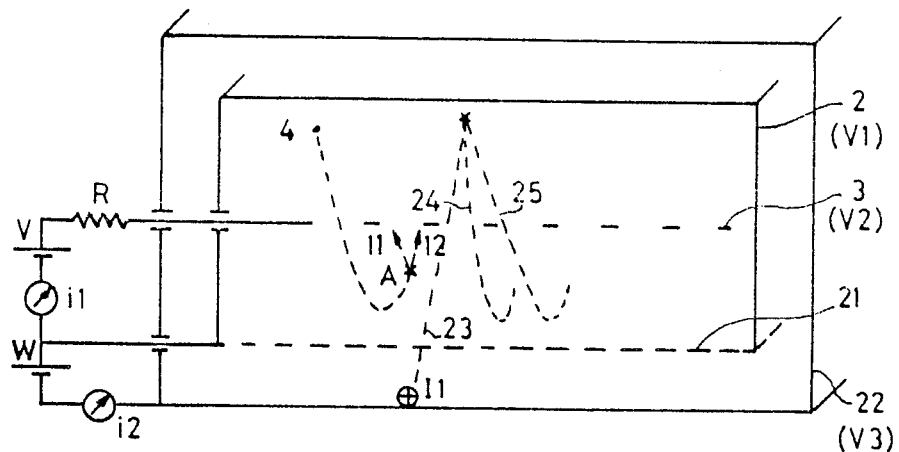
FIG. 2 is a schematic and simplified cross-section view of a plasma generator according to another embodiment of the invention.

FIG. 2 shows a plasma generator according to an alternative embodiment of the invention. In FIG. 2, one can see again the transparent electrode 3 at a potential V2, surrounded by a chamber 2 at a potential V1 lower than potential V2. In this embodiment, a part 21 of the chamber 2 is itself comprised of a transparent electrode and the chamber 2 is surrounded with a second chamber 22 at a potential V3 lower or equal to the potential V1. Such a structure provides an increase of secondary effects. Indeed, while in the first embodiment the difference between the potentials V2 and V1 could be in the range of 400 volts, in this second embodiment, the difference between the potentials V2 and V1 can be in the range of 200 volts and the difference between the potential V2 and V3 in the range of 800 volts, all the other parameters being identical. It results therefrom an increase of the secondary effects due to the acceleration of the ions under a potential difference V2−V3 larger than the potential differnce V2−V1 of FIG. 1. The ions strike the walls of chamber 22 and the extracted electrons are accelerated again towards the opposite walls of the first chamber 2, whereby an electron emission is obtained and the electronic current in the plasma generator is increased. This makes it possible to reduce, as formerly mentioned, the potential difference V2−V1 with respect to the first embodiment and thereby to reduce the power dissipated onto the transparent electrode 3.

FIG. 2 also shows a simplified circuit makes it possible to determine the electrical potentials for the operation of such a generator and for circulating the necessary electrical currents. This circuit comprises, in addition to the elements shown in FIG. 1, a second DC voltage source W and a second current measuring means i2.

It can be desirable to use the secondary effects on the walls for ionizing the atoms from those walls. In a structure of the type shown in FIG. 2, by increasing the voltage difference V1−V3, for example some thousands of volts, ions are sufficiently accelerated between electrode 21 and electrode 22 for sputtering the material of wall 22 and emitting atoms which enter the chamber 2 and which are ionized therein, the initial gas being progressively replaced by the gas comprising the wall atoms.

If one considers again the explanation given in connection with FIG. 1, an initial electron 4 produces from a collision at a point A two secondary electrons 11 and 12 and one ion $I_1$. This ion $I_1$, at its collision onto the wall 22 produces at least one secondary electron 23 which, on collision on the opposite wall of the chamber 2 produces, for example, two secondary electrons 24 and 25 which contribute to the phenomenon according to the invention.

When the generator is on, an electrical current is created by the movement of the electrons and ions. For a given generator geometry, a given gas and given electrical voltages between the electrodes, the intensity of the electric current depends only upon the gas pressure. Therefore, such an ion and electron generator can be used as an ionization vacuum gauge by measuring said current, in particular in the pressure range from $10^{-1}$ to $10^{-4}$ torr.

Figure 3A:
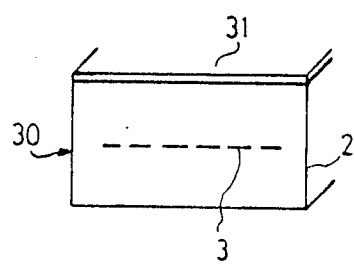
FIG. 3A shows an embodiment of the plasma generator for use as a light source.

FIG. 3A shows a first application as a light source of the plasma generator 1 of FIG. 1 or the plasma generator 20 of FIG. 2. In this application, the upper face 31 of the generator is optically transparent while comprising means for constituting an equipotential surface, for example a metallic grid or an optically transparent and electrically conductive layer on its internal face. One can thus obtain light sources, in particular in the ultraviolet field, having various shapes and sizes and a low consumption.

Figure 3B:
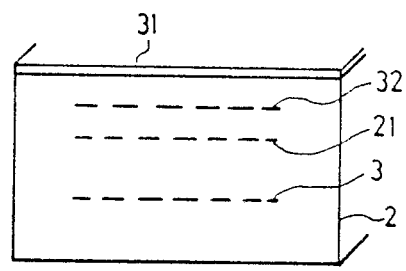
FIG. 3B shows another implementation of the invention as a light source.

FIG. 3B shows another embodiment of a light source wherein the ions do not strike the transparent optical face 31 of the chamber. A transparent electrode 32 (according to the meaning of the present description) is inserted between the ionization space delimited by a transparent electrode 21 corresponding to the one of FIG. 2 and the optical window 31. This electrode 32 is at an electrical potential sufficient for repelling the ions which should have crossed electrode 21 in order to send them back towards the latter.

In the embodiments of FIGS. 3A and 3B, one can also provide in the chamber reflecting mirrors or other optical systems for increasing the intensity of the emitted light or focusing same.

FIG. 4 shows an ion source 40 obtained from the second embodiment of the plasma generator 20 shown in FIG. 2. In FIGS. 2 and 4, similar elements have the same reference numerals, symbols or characters;. In addition to the plasma generator of FIG. 2, the ion source of FIG. 4 comprises an output for extracting ions constituted of a transparent electrode 41 arranged in a part of the wall of the second chamber 22 in front of the transparent electrode 21 in the wall of the first chamber 2. Additionally, an ion accelerating and eventually focusing electrode 42 is arranged in front of the transparent electrode 41. The potential V4 of electrode 42 is lower than the potential V3 of electrode 41.

For obtaining a special shape of the output beam, rather than giving to the accelerating electrode or other electronic optics 32 any specific shape, it is possible, as shown in the embodiment of FIG. 5, to confer a convex, for example spherical or parabolic form to the first, second and third transparent electrodes 3, 21 and 41. It is thus possible to obtain easily a converging ion beam 50. This is possible due to the fact that the plasma generator provides ions onto the important surface of the transparent electrode 21. This configuration makes it possible to obtain higher ion beam intensities.

As an example of operating range, the gas filling the plasma generator can have a pressure comprised between $10^{-2}$ and $10^{-3}$ mm Hg, the accelerating voltages V3-V4 or V1-V4 can be in the range of some tens of kV/cm. One can also obtain accelerated ion beams with large sizes and various shapes according to the design of the various transparent electrodes and the extracting electrode (large surface beam, elongated beam with a large section, cylindrical beam, converging high intensity beam, etc.). As an example, one has obtained nitrogen ion beams with a cross-section of 30 cm×5 cm and an intensity of 40 milliamperes. Similarly, elongated beams of 0.8 cm×30 cm have been obtained with an intensity of 5 mA. However, those results only correspond to first experiments made by the inventors and it is clear that larger values can be obtained in the practicising of the invention.

Another application of the plasma generator according to the invention as an ionic pump is shown in FIG. 6. One finds again in this figure the first chamber 2, the first transparent electrode 3, the second transparent electrode 21 in the wall of the first chamber 2 and the second chamber 22. The whole plasma generator is arranged into a third chamber 60 communicating through an aperture 61 with the medium which has to be evacuated. The walls of the first and second chambers 2 and 22 are respectively provided with apertures 62 and 63 for permitting entry or the gas from the aperture 61 inside the first chamber 2. Therefore, the gases in this first chamber will be ionized and, through the transparent electrode 21, cross the first chamber 2 for being directed toward a receiving surface provided in front of the second electrode 21 on the wall of the second chamber 22, for example. This receiving surface acts as a trap for ions and can for example be a titanium plate 64, as known.

It will be understood that, when the pressure decreases too much in the chamber 2 further to the trapping of ions, for example to a value lower than $10^{-3}$ or $10^{-4}$ mm Hg, according to the pumped gas, the ionization stops in the first chamber and the pumping is stopped. For allowing to further lower the pressure, an additional ionization means is provided inside the first chamber 2, for example one or more hot wires 65 through which passes an electrical current, emitting electrons which are attracted by the transparent electrode 3 and oscillate within the chamber. This permits the start of ionization at low pressure, this ionization being then amplified by the device according to the invention.

It will be noted that such a ionic pump has to be preceded by a preliminary pumping means for lowering the residual gas pressure in the generator at a pressure which permits this generator to operate normally. When the pressure has decreased sufficiently for the plasma generator, the preliminary pumping means can be stopped.

Of course, the invention can be submitted to various modifications. For example, among the applications of the invention, some have been disclosed in connection with the first or the second embodiment of FIGS. 1 and 2. It is clear that those applications can be implemented with the other embodiment. Also, the use of hot wires like the hot wires 65 used in the ionic pump shown in FIG. 6 can be adapted to other applications of the invention if one wishes to work at low pressure for specific reasons. Other ionization means can be used, for example a beam of ionizing particles crossing the generator chamber.

We claim:

1. A plasma generator comprising a chamber at a first potential (V1) filled with a low pressure gas to be ionized, said chamber having mounted therein an electrode at a second potential (V2) higher than the first potential by a quantity larger than the ionization threshold of the gas to be ionized, wherein said electrode comprises a generally planar equipotential surface transparent to ions and electrons, whereby ions and electrons passing therethrough from one side of said surface to the other are subjected to said V2/V1 potential difference.

2. A plasma generator according to claim 1, wherein a wall of said chamber is comprised, at least in part, of a second electrode transparent to ions and electrons, and said chamber is surrounded by a second chamber, the second chamber being at a third potential (V3) lower than the first potential (V1).

3. A plasma generator according to claim 2, wherein the difference between the first and third potentials (V1−V3) is sufficient to cause the ions to sputter atoms from the walls of the second chamber.

4. A plasma generator according to claim 1 including means for measuring electrical current circulating in the generator, whereby the plasma generator constitutes an ionization vacuum gauge.

5. A plasma generator according to claim 1, wherein a part of the wall of the first chamber is optically transparent and includes means for constituting a conducting equipotential surface, whereby the plasma generator constitutes a light source.

6. A plasma generator according to claim 1, wherein a wall of the chamber comprises an electrode transparent to ions, and an ion accelerating electrode mounted outside said chamber in front of, said transparent electrode in the wall of said chamber whereby the plasma generator constitutes an ion source.

7. A plasma generator according to claim 6, wherein the transparent electrode has a convex shape and the accelerating electrode has a convex shape, for providing a converging ion beam.

8. A plasma generator according to claim 1, further comprising, inside the first chamber, ionization means.

9. A plasma generator according to claim 8, wherein said ionization means comprises one or more electrical wires.

10. A plasma generator according to claim 2, wherein a wall of said second chamber comprises an electrode transparent to ions, and an ion accelerating electrode mounted outside said second chamber in front of said transparent electrode in the wall of said second chamber, whereby the plasma generator constitutes an ion source.

* * * * *